(12) United States Patent
Liang et al.

(10) Patent No.: US 7,714,615 B2
(45) Date of Patent: May 11, 2010

(54) DE-EMPHASIS CIRCUIT FOR A VOLTAGE MODE DRIVER USED TO COMMUNICATE VIA A DIFFERENTIAL COMMUNICATION LINK

(75) Inventors: Yikai Liang, Cupertino, CA (US);
Arvind Bomdica, Fremont, CA (US);
Min Xu, Mountain View, CA (US);
Ming-Ju Lee, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 54 days.

(21) Appl. No.: 12/032,741

(22) Filed: Feb. 18, 2008

(65) Prior Publication Data

US 2009/0168854 A1 Jul. 2, 2009

Related U.S. Application Data

(60) Provisional application No. 61/017,308, filed on Dec. 28, 2007.

(51) Int. Cl.
*H03K 19/094* (2006.01)

(52) U.S. Cl. .......................................... 326/83; 326/27

(58) Field of Classification Search .................. 326/26, 326/27, 30, 82–87
See application file for complete search history.

(56) References Cited

U.S. PATENT DOCUMENTS

| | | | |
|---|---|---|---|
| 6,803,790 B2 * | 10/2004 | Haycock et al. | 326/82 |
| 6,867,618 B2 * | 3/2005 | Li et al. | 326/83 |
| 7,501,851 B2 * | 3/2009 | Venditti et al. | 326/30 |
| 2006/0071689 A1 | 4/2006 | Poechmueller | |
| 2007/0103220 A1 | 5/2007 | Kim et al. | |
| 2007/0139086 A1 | 6/2007 | Liu | |

OTHER PUBLICATIONS

International Search Report for International Application No. PCT/US08/88169, May 18, 2009, 4 pp.
Written Opinion for International Application No. PCT/US08/88169, May 18, 2009, 5 pp.

* cited by examiner

*Primary Examiner*—Don P Le
(74) *Attorney, Agent, or Firm*—Vedder Price P.C.

(57) ABSTRACT

A circuit for de-emphasizing information transmitted via a differential communication link includes a voltage mode differential circuit and a bi-directional current source circuit. The voltage mode differential circuit includes a first and second output terminal. The voltage mode differential circuit provides a first voltage via the first output terminal and second voltage via the second output terminal in response to a differential input voltage. The bi-directional current source circuit is operatively coupled between the first and second terminals. The bi-directional current source circuit selectively provides current in a first and second direction between the first and second terminals based on the first and second voltage.

20 Claims, 5 Drawing Sheets

DE-EMPHASIS CIRCUIT FOR A VOLTAGE MODE DRIVER USED TO COMMUNICATE VIA A DIFFERENTIAL COMMUNICATION LINK

CROSS-REFERENCE TO RELATED APPLICATIONS

The present patent application claims priority from and the benefit of U.S. Provisional Patent Application No. 61/017,308, filed Dec. 28, 2007, and entitled DE-EMPHASIS CIRCUIT FOR A VOLTAGE MODE DRIVER USED TO COMMUNICATE VIA A DIFFERENTIAL COMMUNICATION LINK, which prior application is hereby fully incorporated herein by reference.

FIELD

The present disclosure generally relates to voltage mode driver de-emphasis circuits for communicating via a differential communication link, and more particularly, to reducing power consumption of voltage mode driver de-emphasis circuits.

BACKGROUND

Increasing processing speeds of devices such as graphics processors, hard disks, network cards, and other high speed I/O devices have created a need for an increased bandwidth for communicating between devices. One way to increase bandwidth between the bridge circuit and the I/O device is to use a differential communication link such as PCI Express™, HyperTransport™, SATA, USB, and other suitable differential communication links. Such interfaces are a flexible, hybrid serial-parallel interface format that uses multiple differential communication links often referred to as lanes. Each link includes transmit lanes to transmit information and receive lanes to receive information.

In high speed transmission, there are losses in the lanes. In order to compensate for the losses, transmission circuits associated with the transmit lanes use de-emphasis to reduce the transmitter data amplitude for repeating bits of data. More specifically, data is transmitted at full amplitude for each polarity (or state) transition (e.g., 0 to 1, 1 to 0, 1 to –1, –1 to 1, etc.) and thereafter repeating bits of the same polarity (or state) are transmitted at reduced amplitude.

Referring to FIG. 1, a typical prior art transmission circuit 100 includes a predriver circuit 102 and a de-emphasis circuit 104. The transmission circuit 100 can include a current mode driver circuit (not shown) or a voltage mode driver circuit 106. In some applications, voltage mode driver circuits are preferred over current mode driver circuits because they consume less power when transmitting at full power (e.g., not de-emphasizing repeating bits). The de-emphasis circuit 104 provides a differential voltage transmission signal 108 via a first terminal 110 and second terminal 112.

The de-emphasis circuit 104 includes a first uni-directional current source 114, a second uni-directional current source 116, a third uni-directional current source 118, and a fourth uni-directional current source 120. The first uni-directional current source 114 is coupled between a first power source 122 and the first terminal 110. The second uni-directional current source 116 is coupled between the second terminal 112 and a second power source 124, which provides a supply voltage less than the first power source 122. The third uni-directional current source 118 is coupled between the first power source 122 and the second terminal 112. The fourth uni-directional current source 120 is coupled between the first terminal 110 and the second terminal 112.

In general, the voltage mode de-emphasis circuit 104 de-emphasizes the differential voltage transmission signal 108 (e.g., reduces transmission amplitude) by using separate uni-directional current sources to source current from a positive terminal and to sink current into a negative terminal. For example, if the differential voltage transmission signal 108 has a negative voltage on the first terminal 110 and a positive voltage on terminal 112, current source 114 sinks current into terminal 110 while current source 116 sources current from terminal 112. Likewise, if the differential voltage transmission signal 108 has a positive voltage on the first terminal 110 and a negative voltage on terminal 112, current source 118 sinks current into terminal 112 while current source 120 sources current from terminal 110.

A control circuit 126 selectively controls the current source pairs 114, 116 and 118, 120 based on polarity (or state) signals 130, 132 from predriver circuit 102 in order to de-emphasize the differential signal 128. The polarity (or state) signals 130, 132 are based on the polarity (or state) of the differential signal 128. More specifically, the control circuit 126 determines whether a polarity (or state) change of the differential signal 128 has occurred. If the polarity (or state) change has not occurred, the control circuit 126 enables the current source pairs 114, 116 and/or 118, 120 in order to de-emphasize repeated bits of data of the differential voltage transmission signal 108. For example, if a voltage at terminal 110 is greater than a voltage at terminal 112, the control circuit 126 enables uni-directional current source 120 to source current from terminal 110 and enables uni-directional current source 118 to sink current into terminal 112. If, for example, a voltage at terminal 110 is less than a voltage at terminal 112, the control circuit 126 enables uni-directional current source 114 to sink current into terminal 110 and enables uni-directional current source 116 to source current from terminal 112

Accordingly, the more bits that are repeated and thus de-emphasized, the more current the uni-directional current sources 114, 116, 118, 120 provide, which in turn increases power consumption of the de-emphasis circuit 104. For example, in one embodiment, an extra 9 mA of current is required in order to achieve 6 dB of de-emphasis. As such, more power is consumed by the de-emphasis circuit 104 when using the extra 9 mA to de-emphasis the differential voltage transmission signal 108.

It is therefore desirable, among other things, to provide a de-emphasis circuit for a voltage mode driver that consumes less power than conventional de-emphasis circuits.

BRIEF DESCRIPTION OF THE DRAWINGS

The invention will be more readily understood in view of the following description when accompanied by the below figures, wherein like reference numerals represent like elements.

DETAILED DESCRIPTION

Figure 1:
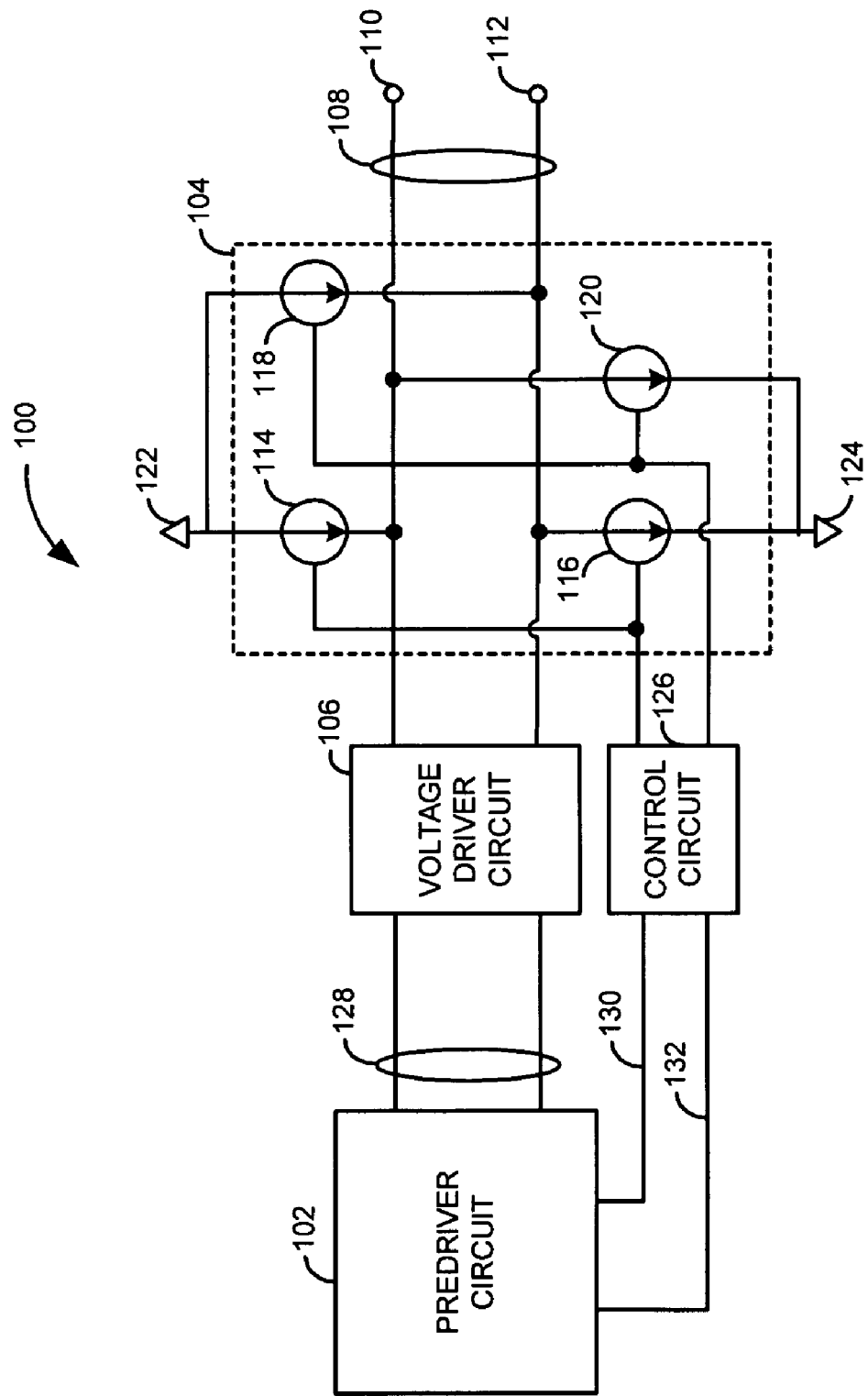
FIG. 1 is a functional block diagram of one example a transmission circuit having a de-emphasis circuit according to the prior art.

In one example, a circuit for de-emphasizing information transmitted via a differential communication link includes a voltage mode differential circuit and a bi-directional current source circuit. The voltage mode differential circuit includes a first and second output terminal. The voltage mode differential circuit provides a first voltage via the first output terminal and second voltage via the second output terminal in response to a differential input voltage. The bi-directional current source circuit is operatively coupled between the first and second terminals. The bi-directional current source circuit selectively provides current in a first and second direction between the first and second terminals based on the first and second voltage in order to de-emphasize the differential input voltage thereby providing a differential output signal.

Among other advantages, the circuit consumes less power than conventional voltage mode de-emphasis circuits. The circuit uses the bi-directional current source so the same current that is sourced from the positive side of the differential output signal is used to sink into the negative side of the differential output signal. Accordingly, less current is used to de-emphasize the differential output signal, which in turn reduces power consumption of the circuit. Other advantages will be recognized by those of ordinary skill in the art.

In one example, the current is sourced from the first output terminal and sunk into the second output terminal when the first voltage is greater than the second voltage. In one example, the current is sourced from the second output terminal and sunk into the first output terminal when the second voltage is greater than the first voltage.

In one example, the bi-directional current source circuit provides the current in the first direction when the first voltage is greater than the second voltage. In one example, the bi-directional current source circuit provides the current in the second direction when the second voltage is greater than the first voltage.

In one example, the bi-directional current source circuit comprises a plurality of current source circuits configured in parallel between the first output terminal and the second output terminal.

In one example, the circuit includes a control circuit, operatively coupled to the bi-directional current source circuit. The control circuit selectively controls a magnitude of the current to produce a de-emphasized output signal. In one example, the control circuit increases the magnitude based on a change in polarity of the first and second voltage. In one example, the control circuit decreases the magnitude based on an absence of a change in polarity of the first and second voltage.

In one example, an integrated circuit includes a transceiver that transmits a first differential signal and receives a second differential signal. The transceiver circuit includes a transmission circuit that transmits the first differential signal and a receive circuit that receives the second differential signal. The transmission circuit includes the voltage mode differential circuit and the bi-directional current source circuit.

In one example, a system includes the integrated circuit and a second integrated circuit that includes second transceiver circuit that transmits the second differential signal and receives the first differential signal. The second transceiver circuit includes a second transmission circuit that transmits the second differential signal and a second receive circuit that receives the first differential signal. The second transmission circuit includes a second voltage mode differential circuit and a second bi-directional current source circuit. The second voltage mode differential circuit includes a third and fourth output terminal. The second voltage mode differential circuit provides a third voltage via the third output terminal and fourth voltage via the fourth output terminal in response to a second differential input voltage. The second bi-directional current source circuit is operatively coupled to the third and fourth terminals. The second bi-directional current source circuit selectively provides current in a third and fourth direction between the third and fourth terminals based on the third and fourth voltage in order to de-emphasize the second differential input voltage. The second transmission circuit transmits the second differential signal based on the third and fourth voltage.

In one example, the system includes a processor operatively coupled to the first integrated circuit. In one example, the system includes memory operatively coupled to the first integrated circuit. In one example, the system includes a display operatively coupled to the second integrated circuit.

In one example, a computer readable medium includes information that when executed by a processor causes the processor to operate, design, and/or organize a circuit that includes the voltage mode differential circuit and the bi-directional current source circuit. In one example, the information includes hardware description language.

As used herein, the term "circuit" can include an electronic circuit, one or more processors (e.g., shared, dedicated, or group of processors such as but not limited to microprocessors, DSPs, or central processing units), and memory that execute one or more software or firmware programs, combinational logic circuits, an ASIC, and/or other suitable components that provide the described functionality. Additionally, as will be appreciated by those of ordinary skill in the art, the operation, design, and organization, of a "circuit" can be described in a hardware description language such as Verilog™, VHDL, or other suitable hardware description languages.

Figure 2:
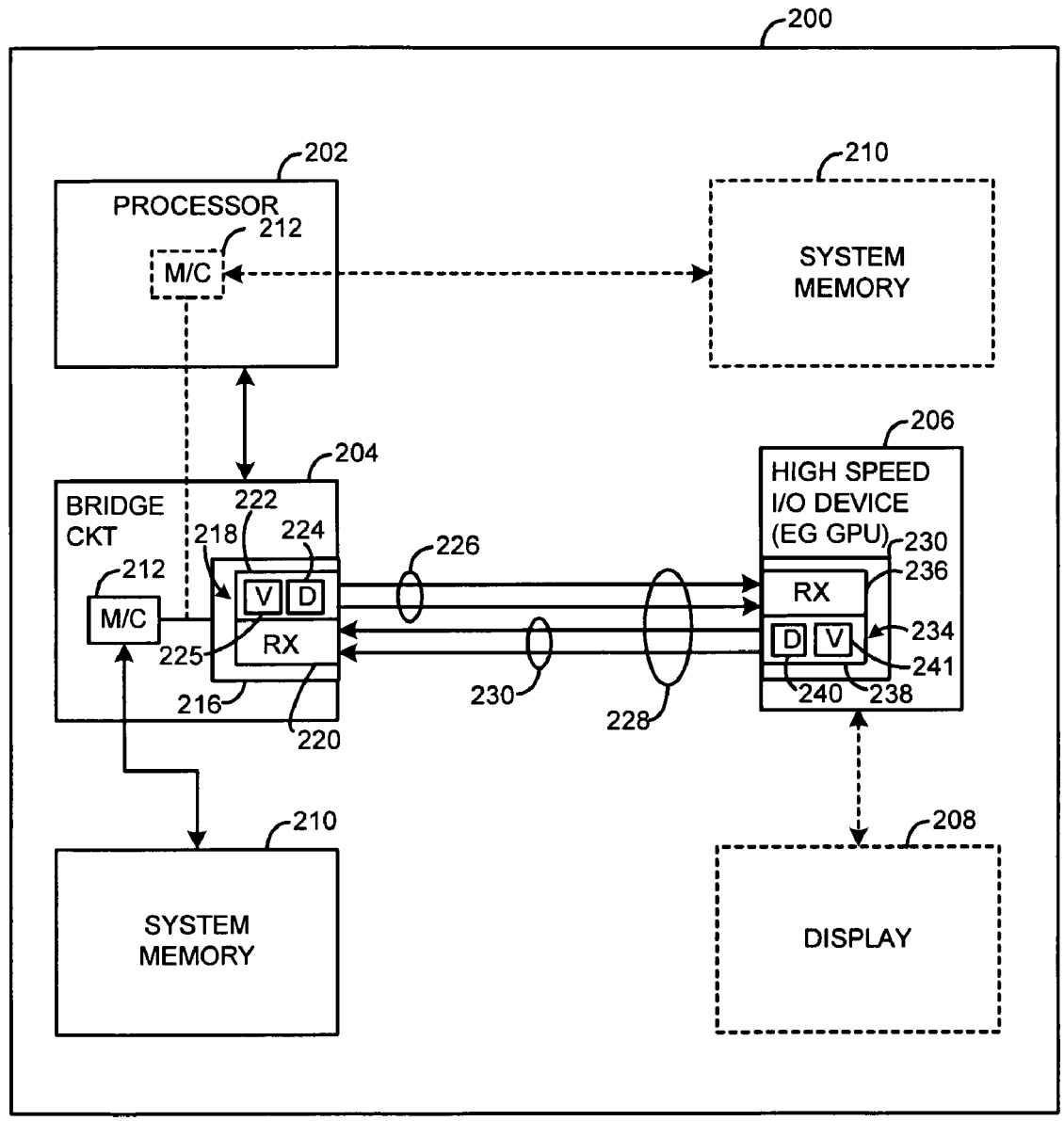
FIG. 2 is a functional block diagram of a device that includes a transmission circuit having de-emphasis circuit according to the present disclosure.

Referring now to FIG. 2, an exemplary functional block diagram of a device 200 such as a wireless phone, a mobile and/or stationary computer, a printer, a LAN interface (wireless and/or wired), a media player, a video decoder and/or encoder, and/or any other suitable digital device is depicted. The device 200 includes at least one processor 202, a bridge circuit 204, a high speed I/O device 206 such as a graphics processor (or core) and associated display 208, and system memory 210.

The processor 202 is operatively coupled to the bridge circuit 204 and processes requests from the bridge circuit 204. In some embodiments, the bridge circuit 204 includes a memory controller 212 that is operatively coupled to the system memory 210. The system memory 210 stores information communicated from the bridge circuit 204. In other embodiments, the processor 202 includes the memory controller 212 that is operatively coupled to the system memory 212, which stores information communicated from the processor 202.

The bridge circuit 204 includes a first transceiver circuit 216. The first transceiver circuit 216 includes a first transmission circuit 218 and a first receiver circuit 220. The first transmission circuit 218 includes a first de-emphasis circuit 224 and a first voltage mode differential driver circuit 225. The transmission circuit 218 transmits information via a first differential link 226 of a differential communication link 228. The receiver circuit 220 receives information via a second differential link 230 of the differential communication link 228. The differential communication link 228 can be any suitable differential communication link such as, but not limited to, PCI Express™, HyperTransport™, SATA, USB, and other suitable differential communication links.

The first de-emphasis circuit 224 selectively reduces the amplitude used to transmit information using de-emphasis. For example, the first de-emphasis circuit 224 reduces the amplitude used to transmit the information when bits of the information repeat. More specifically, the first de-emphasis circuit 224 transmits information at full amplitude for each polarity (or state) transition (e.g., 0 to 1, 1 to 0, 1 to −1, −1 to 1, or other suitable polarity or state transitions) and thereafter transmits repeating bits of the same polarity (or state) at a reduced amplitude.

Although the first transmission circuit 218 is included in a bridge circuit in this example, skilled artisans will appreciate that the transmission circuit 218 can be included in any other suitable circuit and/or device that employs de-emphasis. Furthermore, skilled artisans will appreciate that the transmission circuit 218 can transmit to any suitable circuit and/or device such as, for example, the high speed I/O device 206.

The high speed I/O device 206 includes a second transceiver circuit 232. The second transceiver circuit 232 includes a second transmission circuit 234 and a second receiver circuit 236. The second transmission circuit 234 includes a second de-emphasis circuit 240 and a second voltage mode differential driver circuit 241. The transmission circuit 234 transmits information via the second differential link 230 of the differential communication link 228. The receiver circuit 232 receives information via the first differential link 226 of the differential communication link 228.

Similar to the first de-emphasis circuit 224, the second de-emphasis circuit 240 selectively reduces the amplitude used to transmit information using de-emphasis. For example, the second de-emphasis circuit 240 reduces the amplitude used to transmit the information when bits of the information repeat. More specifically, the second de-emphasis circuit 240 transmits information at full amplitude for each polarity (or state) transition (e.g., 0 to 1, 1 to 0, 1 to −1, −1 to 1, or other suitable polarity or state transitions) and thereafter transmits repeating bits of the same polarity (or state) at a reduced amplitude.

Although the second transmission circuit 234 is included in a high speed I/O device in this example, skilled artisans will appreciate that the transmission circuit 234 can be included in any other suitable circuit and/or device that employs de-emphasis. Furthermore, skilled artisans will appreciate that the transmission circuit 234 can transmit to any suitable circuit and/or device such as, for example, the bridge circuit 204.

Figure 3:
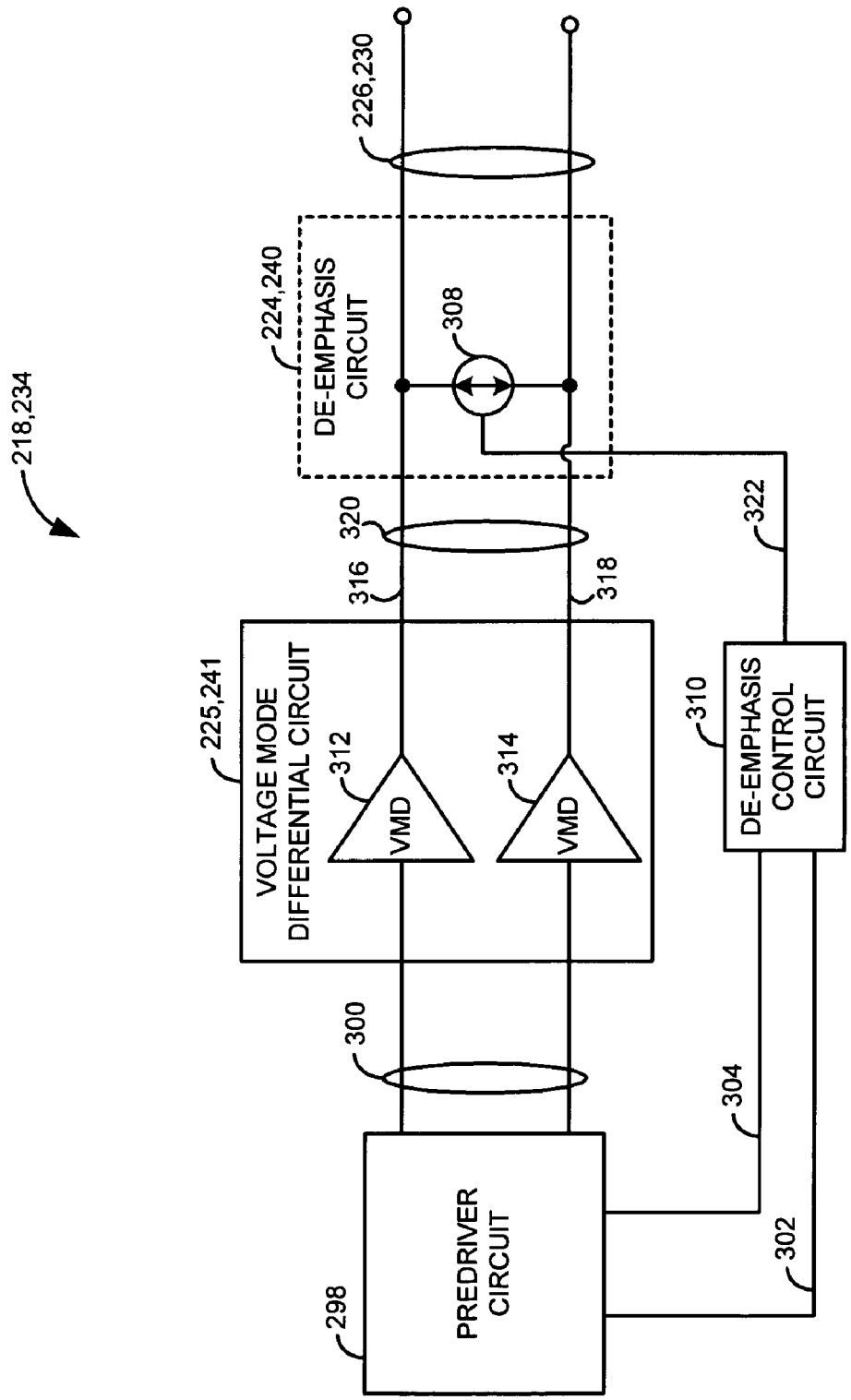
FIG. 3 is a functional block diagram of one example of the transmission circuit.

Referring now to FIG. 3, an exemplary functional block diagram of the transmission circuit 218, 234 is depicted. The transmission circuit 218, 234 includes a predriver circuit 298, the de-emphasis circuit 224, 240, the voltage mode differential driver circuit 225, 241, and a de-emphasis control circuit 310. During operation, the predriver circuit 298 transmits a differential voltage signal 300 via terminal 302 and terminal 304. The transmission circuit 218, 234 selectively varies the amplitude of the differential signal 300 in order to provide information via the differential communication link 226, 230. More specifically, the de-emphasis circuit 224, 240 transmits information at full amplitude for each polarity (or state) transition (e.g., 0 to 1, 1 to 0, 1 to −1, −1 to 1, or other suitable polarity or state transitions) and thereafter transmits repeating bits of the same polarity (or state) at a reduced amplitude.

The de-emphasis circuit 224, 240 includes a bi-directional current source circuit 308. The voltage mode differential driver circuit 225, 241 includes a first voltage mode driver circuit 312 and a second voltage mode driver circuit 314 as known in the art. In one embodiment, the first and second voltage mode drivers 312, 314 have an impedance of approximately 50 Ohms.

The voltage mode differential driver circuit 225, 241 is operatively coupled to the predriver circuit 298 via terminals 302 and 304 and the differential link 226, 230 via output terminals 316 and 318. The bi-directional current source circuit 308 is operatively coupled between output terminals 316 and 318. The de-emphasis control circuit 310 is operatively coupled to the predriver circuit 298 and the bi-directional current source circuit 308.

In response to the differential voltage signal 300, the voltage mode differential driver circuit 225, 241 provides a first voltage at output terminal 316 and a second voltage at output terminal 318 in order to provide a differential output voltage signal 320 to communicate via the differential link 226, 230. The de-emphasis control circuit 310 monitors the differential voltage signal 300 via terminals 302 and 304, for example, and selectively controls the bi-directional current source circuit 308 based thereon. More specifically, the de-emphasis control circuit 310 selectively controls current flow provided by the bi-directional current source circuit 308 via the de-emphasis control information 322 in order to selectively de-emphasis the differential output voltage signal 320.

For example, in response to a change in polarity of the differential voltage signal 300, the de-emphasis control circuit 310 controls the bi-directional current supply circuit 308 to provide a first predetermined amount of current (or no current in some embodiments). However, when the polarity of the differential voltage signal 300 remains constant (e.g., does not change polarity), the de-emphasis control circuit 310 controls the bi-directional current supply circuit 308 provide a second predetermined amount of current, which has a greater magnitude than the first predetermined amount of current. In one embodiment, the first predetermined amount of current is approximately 0 mA and the second predetermined amount of current is approximately 6 mA in order to de-emphasize the differential output voltage signal 320 by 6 dB, although other values are contemplated.

The bi-directional current source circuit 308 provides current flow in a first direction (e.g., from terminal 316 to terminal 318) when the first voltage at terminal 316 is greater than the second voltage at terminal 318. As such, the bi-directional current source circuit 308 sources current from output terminal 316 and sinks the same current (e.g., sourced from output terminal 316) into output terminal 318.

Likewise, the bi-directional current source circuit 308 provides current flow in a second direction (e.g., from terminal 318 to terminal 316) when the second voltage at terminal 318 is greater than the first voltage at terminal 316. As such, the bi-directional current source circuit 308 sources current from output terminal 318 and sinks the same current (e.g., sourced from output terminal 318) into output terminal 316.

Accordingly, the current used to de-emphasis the differential output voltage signal 320 is closed loop (e.g., the same current that is used to source the positive side is used to sink the negative side) and therefore the transmission circuit 218, 234 requires less current, and thus consumes less power, to de-emphasis the differential output voltage signal 320 than a conventional transmission circuit 100. For example, if the voltage at terminal 316 is 0.9 V at full amplitude and the voltage at terminal 318 is 0.3 V at full amplitude, in order to provide 6 dB of de-emphasis, the voltage at terminal 316 should be 0.75 V and the voltage at terminal 318 should be 0.45 V. Assuming the drivers on the transmit and receive side each have an impedance of 50 Ohms, only an extra 3 mA of current is required to de-emphasis the differential output voltage signal 320. As such, the de-emphasis circuit 224,240 of the present disclosure requires approximately three times less current (and thus three times less power) than conventional de-emphasis circuits such as those depicted in FIG. 1.

Figure 4:
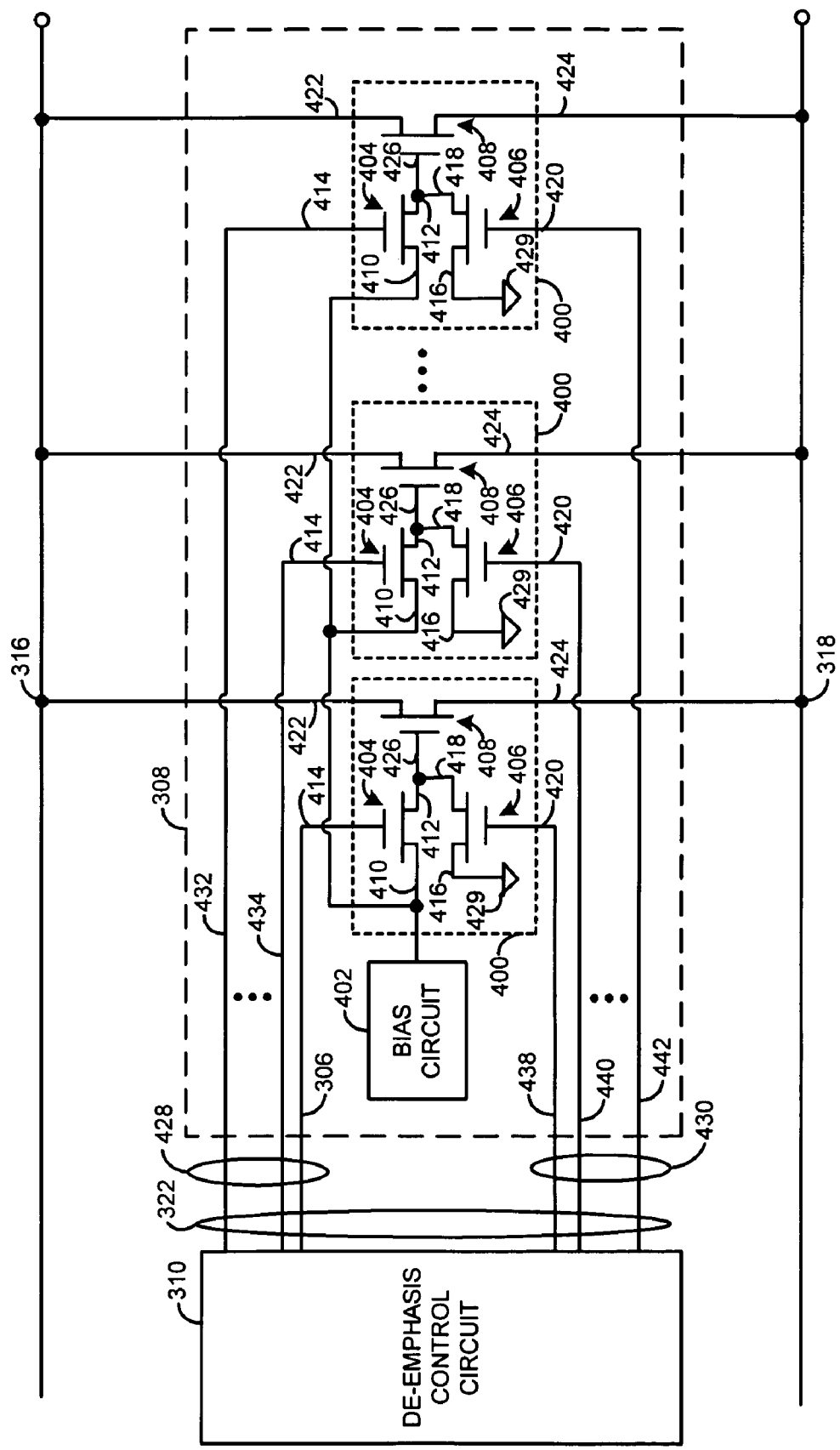
FIG. 4 is an exemplary diagram of one embodiment of a bi-directional current source circuit of the transmission circuit according to the present disclosure.

Referring now to FIG. 4, an exemplary diagram of one embodiment of the bi-directional current source circuit 308 is depicted. In this example, the bi-directional current source circuit 308 includes a plurality of current source circuits 400 and a bias circuit 402. In some embodiments, each of the current source circuits 400 provide a predetermined amount of current such as, for example, 0.5 mA or any other suitable predetermined amount of current. The de-emphasis control circuit 310 controls the magnitude of current provided by the bi-directional current source circuit 308 by selectively enabling particular current source circuits 400. For example, the de-emphasis control circuit 310 can enable three of the current source circuits in order to control the bi-directional current source circuit 308 to provide 1.5 mA of current (assuming that each of the current source circuits 400 provide 0.5 mA).

Each of the current source circuits 400 include a first and second enable transistor 404, 406 and a current source transistor 408. In some embodiments, the transistors are n-channel metal oxide semiconductor field effect transistors (i.e., NMOS transistors). However, any suitable transistor can be used in accordance with the present disclosure, such as, for example, p-channel metal oxide semiconductor field effect transistors (i.e., PMOS transistors).

The first enable transistor 404 includes a first terminal 410, a second terminal 412, and a first enable terminal 414. The second enable transistor 406 includes a third terminal 416, a fourth terminal 418, and a second enable terminal 420. The current source transistor 408 includes a fifth terminal 422, a sixth terminal 424, and a third enable terminal 426. The first terminal 410 is operatively coupled to the bias circuit 402. The second terminal 412 is operatively coupled to the fourth terminal 418 and the third enable terminal 426. The third terminal 416 is operatively coupled to a source circuit 429 such as ground for example. The fifth terminal 422 is operatively coupled to output terminal 316. The sixth terminal 424 is operatively coupled to output terminal 318.

The first enable terminal 414 receives enable information 428, which is based on the de-emphasis control information 322. The second enable terminal 420 also receives enable information 430, which is based on the de-emphasis control information 322. The first and second enable transistors 404, 406 are operative to enable the current source transistor 408 to provide current between output terminals 316, 318 in response to the de-emphasis control information 322. In some embodiments, the de-emphasis control circuit 310 can demultiplex the de-emphasis control information 322 into multiple portions of control information 432, 434, 436, 438, 440, 442 in order to selectively enable particular current source circuits 400. In this manner, the de-emphasis control circuit 310 can selectively control (e.g., enable/disable) each of the current source circuits 400 in order to vary the de-emphasis of the differential output voltage signal 320, which can be used to compensate for losses in various channels of the differential communication link 228.

The bias circuit 402 ensures that the current source transistor 408 is operating in a saturation region so that it can provide current between output terminals 316, 318. In some embodiments, the bias circuit 402 includes a replica of the current source 308 to provide a bias voltage as is known in the art.

Figure 5:
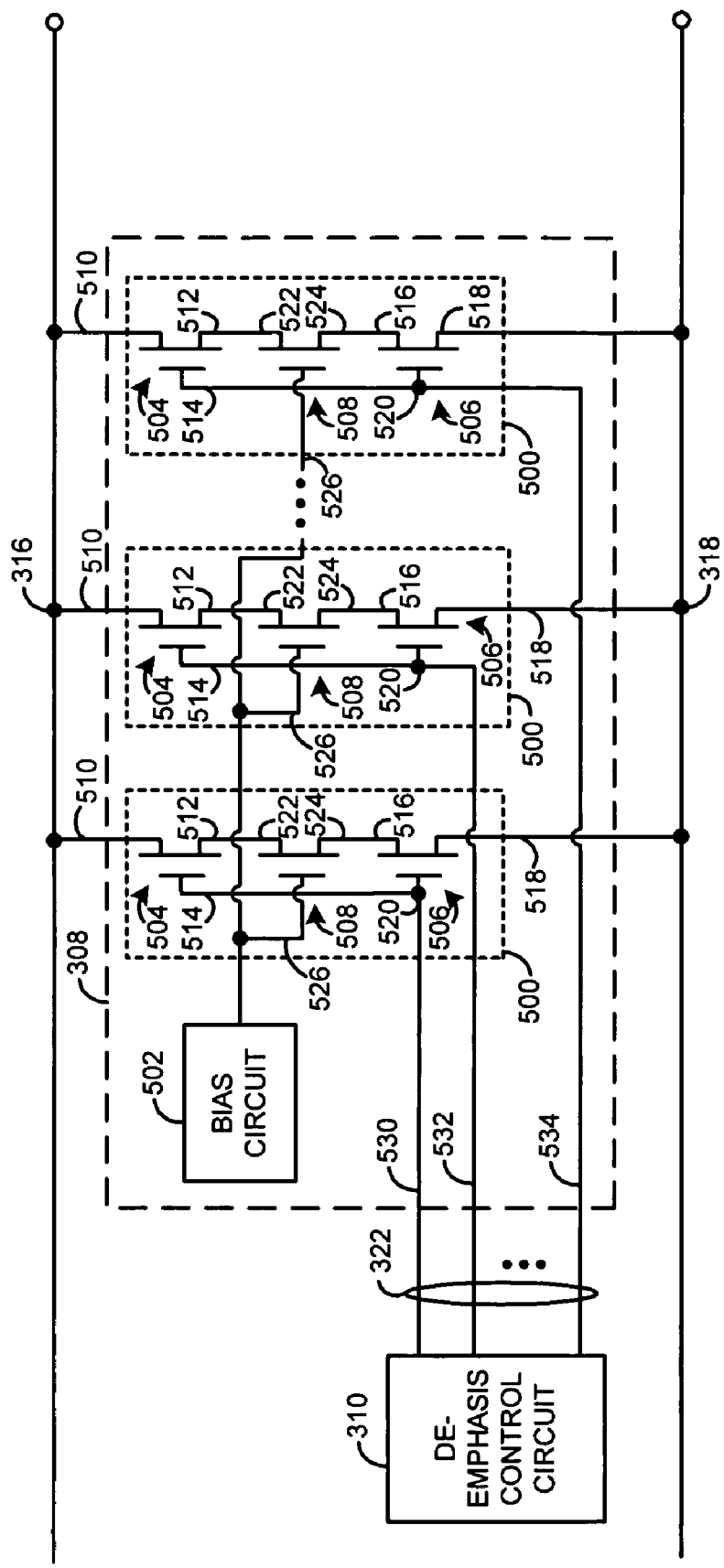
FIG. 5 is an exemplary diagram of another embodiment of the bi-directional current source.

Referring now to FIG. 5, an exemplary diagram of another embodiment of the bi-directional current source circuit 308 is depicted. In this example, the bi-directional current source circuit 308 includes a plurality of current source circuits 500 and a bias circuit 502. In some embodiments, each of the current source circuits 500 provide a predetermined amount of current such as, for example, 0.5 mA or any other suitable predetermined amount of current. The de-emphasis control circuit 310 controls the magnitude of current provided by the bi-directional current source circuit 308 by selectively enabling particular current source circuits 500. For example, the de-emphasis control circuit 310 can enable three of the current source circuits in order to control the bi-directional current source circuit 308 to provide 1.5 mA of current (assuming that each of the current source circuits 500 provide 0.5 mA).

Each of the current source circuits 500 include a first and second enable transistor 504, 506 and a current source transistor 508. In some embodiments, the transistors are NMOS transistors. However, any suitable transistor can be used in accordance with the present disclosure, such as, for example, PMOS transistors.

The first enable transistor 504 includes a first terminal 510, a second terminal 512, and a first enable terminal 514. The second enable transistor 506 includes a third terminal 516, a fourth terminal 518, and a second enable terminal 520. The current source transistor 508 includes a fifth terminal 522, a sixth terminal 524, and a third enable terminal 526. The first terminal 510 is operatively coupled to the output terminal 316. The second terminal 512 is operatively coupled to the fifth terminal 522. The third terminal 516 is operatively coupled to the sixth terminal 524. The third enable terminal 526 is operatively coupled to the bias circuit 502.

The first and second enable terminals 514, 520 receive the de-emphasis control information 322 to enable each of the current source circuits 500. The first and second enable transistors 504, 506 are operative to enable the current source transistor 508 to provide current between output terminals 316, 318 in response to the de-emphasis control information 322. In some embodiments, the de-emphasis circuit 310 can demultiplex the de-emphasis control information 322 into multiple portions of control information 530, 532, 534 in order to selectively enable particular current source circuits 500.

The bias circuit 502 ensures that the current source transistor 508 is operating in a saturation region so that it can provide current between output terminals 316, 318. In some embodiments, the bias circuit 502 includes a replica of the current source 308 to provide a bias voltage as is known in the art.

As noted above, among other advantages, a voltage mode de-emphasis circuit is provided that consumes less power than known voltage mode de-emphasis circuits. The voltage mode de-emphasis circuit uses a bi-directional current source so that the same current used to source the positive side of the differential output voltage signal is used to sink the negative side of the differential output voltage signal. Accordingly, less current is used to de-emphasize the differential output voltage signal, which in turn reduces power consumption of the voltage mode de-emphasis circuit. Other advantages will be recognized by those of ordinary skill in the art.

Also, integrated circuit design systems (e.g., work stations) are known that create integrated circuits based on executable information stored on a computer readable memory such as but not limited to CDROM, RAM, other forms of ROM, hard drives, distributed memory etc. The information may include data representing (e.g., compiled or otherwise represented) any suitable language such as, but not limited to, hardware descriptor language or other suitable language. As such, the "circuits" described herein may also be produced as integrated circuits by such systems. For example an integrated circuit may be created for use in a display using information stored on a computer readable medium that when executed cause the integrated circuit design system to create an integrated circuit that includes a voltage mode differential circuit and a bi-directional current source circuit. The voltage mode differential circuit includes a first and second output terminal. The voltage mode differential circuit provides a first voltage via the first output terminal and second voltage via the second output terminal in response to a differential input voltage. The bi-directional current source circuit is operatively coupled between the first and second terminals. The bi-directional current source circuit selectively provides current in a first and second direction between the first and second terminals based on the first and second voltage. Integrated circuits having a "circuit" that performs other operations described herein may also be suitable produced.

While this disclosure includes particular examples, it is to be understood that the disclosure is not so limited. Numerous modifications, changes, variations, substitutions, and equivalents will occur to those skilled in the art without departing from the spirit and scope of the present disclosure upon a study of the drawings, the specification, and the following claims.

What is claimed is:

1. A circuit for de-emphasizing information transmitted via a differential communication link, comprising:
   a voltage mode differential circuit, having a first and second output terminal, that is operative to provide a first voltage via the first output terminal and second voltage via the second output terminal in response to a differential input voltage; and
   a bi-directional current source circuit, operatively coupled between the first and second terminals, that is operative to selectively provide current in a first and second direction between the first and second terminals based on the first voltage, the second voltage, and de-emphasis control information.

2. The circuit of claim 1 wherein current is sourced from the first output terminal and sunk into the second output terminal when the first voltage is greater than the second voltage and wherein the current is sourced from the second output terminal and sunk into the first output terminal when the second voltage is greater than the first voltage.

3. The circuit of claim 1 wherein the bi-directional current source circuit is operative to provide the current in the first direction when the first voltage is greater than the second voltage and to provide the current in the second direction when the second voltage is greater than the first voltage.

4. A circuit for de-emphasizing information transmitted via a differential communication link, comprising:
   a voltage mode differential circuit, having a first and second output terminal, that is operative to provide a first voltage via the first output terminal and second voltage via the second output terminal in response to a differential input voltage; and
   a bi-directional current source circuit, operatively coupled between the first and second terminals, that is operative to selectively provide current in a first and second direction between the first and second terminals based on the first and second voltage, wherein the bi-directional current source circuit comprises a plurality of current source circuits configured in parallel between the first output terminal and the second output terminal.

5. The circuit of claim 4 wherein at least one of the plurality of current source circuits comprises:
   a first transistor having a first terminal operatively coupled to a bias circuit, a second terminal, and a first enable terminal operative to receive at least one portion of enable information, wherein the first transistor is responsive to the at least one portion of enable information;
   a second transistor having a third terminal operatively coupled to a voltage source, a fourth terminal operatively coupled to the second terminal, and a second enable terminal operative to receive the at least one portion of enable information, wherein the second transistor is responsive to the at least one portion of enable information; and
   a third transistor having a fifth terminal operatively coupled to the first output terminal, a sixth terminal operatively coupled to the second output terminal, and a third enable terminal operatively coupled to the second and fourth terminals, wherein the third transistor is operative to provide the current in response to the at least one portion of enablement information.

6. The circuit of claim 4 wherein at least one of the plurality of current source circuits comprises:
   a first transistor having a first terminal operatively coupled to the first output terminal, a second terminal, and a first enable terminal operative to receive at least one portion of enablement information, wherein the first transistor is responsive to the at least one portion of enablement information;
   a second transistor having a third terminal operatively coupled to the second terminal, a fourth terminal, and a second enable terminal operatively coupled to a bias circuit, wherein the second transistor is operative to provide the current; and
   a third transistor having a fifth terminal operatively coupled to the fourth terminal, a sixth terminal operatively coupled to the second output terminal, and a third enable terminal operative to receive the at least one portion of enablement information, wherein the third transistor is responsive to the at least one portion of enablement information.

7. A circuit for de-emphasizing information transmitted via a differential communication link, comprising:
   a voltage mode differential circuit, having a first and second output terminal, that is operative to provide a first voltage via the first output terminal and second voltage via the second output terminal in response to a differential input voltage;
   a bi-directional current source circuit, operatively coupled between the first and second terminals, that is operative to selectively provide current in a first and second direction between the first and second terminals based on the first and second voltage; and
   a control circuit, operatively coupled to the bi-directional current source circuit, that is operative to selectively control a magnitude of the current to produce a de-emphasized output signal.

8. The circuit of claim 7 wherein the control circuit is operative to increase the magnitude based on a change in polarity of the first and second voltage.

9. The circuit of claim 7 wherein the control circuit is operative to decrease the magnitude based on an absence of a change in polarity of the first and second voltage.

10. An integrated circuit, comprising:
    a transceiver circuit that is operative to transmit a first differential signal and to receive a second differential signal, comprising:
       a transmission circuit that comprises:

a voltage mode differential circuit, having a first and second output terminal, that is operative to provide a first voltage via the first output terminal and second voltage via the second output terminal in response to a differential input voltage; and a bi-directional current source circuit, operatively coupled between the first and second terminals, that is operative to selectively provide current in a first and second direction between the first and second terminals based on the first voltage, the second voltage, and de-emphasis control information in order to de-emphasize the differential input voltage, wherein the transmission circuit is operative to transmit the first differential signal based on the first voltage and the second voltage; and a receiver circuit that is operative to receive the second differential signal.

11. The integrated circuit of claim 10 wherein the bi-directional current source circuit is operative to provide the current in the first direction when the first voltage is greater than the second voltage and to provide the current in the second direction when the second voltage is greater than the first voltage.

12. An integrated circuit, comprising:
a transceiver circuit that is operative to transmit a first differential signal and to receive a second differential signal, comprising:
a transmission circuit that comprises:
a voltage mode differential circuit, having a first and second output terminal, that is operative to provide a first voltage via the first output terminal and second voltage via the second output terminal in response to a differential input voltage; and
a bi-directional current source circuit, operatively coupled between the first and second terminals, that is operative to selectively provide current in a first and second direction between the first and second terminals based on the first and second voltage in order to de-emphasize the differential input voltage, wherein the transmission circuit is operative to transmit the first differential signal based on the first voltage and the second voltage, wherein the bi-directional current source circuit comprises a plurality of current source circuits configured in parallel between the first output terminal and the second output terminal.

13. An integrated circuit, comprising:
a transceiver circuit that is operative to transmit a first differential signal and to receive a second differential signal, comprising:
a transmission circuit that comprises:
a voltage mode differential circuit, having a first and second output terminal, that is operative to provide a first voltage via the first output terminal and second voltage via the second output terminal in response to a differential input voltage;
a bi-directional current source circuit, operatively coupled between the first and second terminals, that is operative to selectively provide current in a first and second direction between the first and second terminals based on the first and second voltage in order to de-emphasize the differential input voltage, wherein the transmission circuit is operative to transmit the first differential signal based on the first voltage and the second voltage; and a control circuit, operatively coupled to the bi-directional current source circuit, that is operative to selectively control a magnitude of the current to produce a de-emphasized output signal.

14. The integrated circuit of claim 13 wherein the control circuit is operative to increase the magnitude based on a change in polarity of the first and second voltage and to decrease the magnitude based on an absence of the change in polarity of the first and second voltage.

15. A system, comprising:
a first integrated circuit, comprising:
a first transceiver circuit that is operative to transmit a first differential signal and to receive a second differential signal, comprising:
a first transmission circuit that comprises:
a first voltage mode differential circuit, having a first and second output terminal, that is operative to provide a first voltage via the first output terminal and second voltage via the second output terminal in response to a first differential input voltage; and
a first bi-directional current source circuit, operatively coupled between the first and second terminals, that is operative to selectively provide current in a first and second direction between the first and second terminals based on the first and second voltage in order to de-emphasize the first differential input voltage, wherein the first transmission circuit is operative to transmit the first differential signal based on the first voltage, the second voltage, and first de-emphasis control information; and
a first receiver circuit that is operative to receive the second differential signal; and
a second integrated circuit, comprising:
a second transceiver circuit that is operative to transmit the second differential signal and to receive the first differential signal, comprising:
a second transmission circuit that comprises:
a second voltage mode differential circuit, having a third and fourth output terminal, that is operative to provide a third voltage via the third output terminal and fourth voltage via the fourth output terminal in response to a second differential input voltage; and
a second bi-directional current source circuit, operatively coupled between the third and fourth terminals, that is operative to selectively provide current in a third and fourth direction between the third and fourth terminals based on the third and fourth voltage in order to de-emphasize the second differential input voltage, wherein the second transmission circuit is operative to transmit the second differential signal based on the third voltage, the fourth voltage, and second de-emphasis control information;
a second receiver circuit that is operative to receive the first differential signal.

16. A system, comprising:
a first integrated circuit, comprising:
a first transceiver circuit that is operative to transmit a first differential signal and to receive a second differential signal, comprising:
a first transmission circuit that comprises:
a first voltage mode differential circuit, having a first and second output terminal, that is operative to provide a first voltage via the first output terminal and second voltage via the second output terminal in response to a first differential input voltage;

a first bi-directional current source circuit, operatively coupled between the first and second terminals, that is operative to selectively provide current in a first and second direction between the first and second terminals based on the first and second voltage in order to de-emphasize the first differential input voltage, wherein the first transmission circuit is operative to transmit the first differential signal based on the first and second voltage; and at least one of: a processor operatively coupled to the first integrated circuit, memory operatively coupled to the first integrated circuit, and a display operatively coupled to the second integrated circuit.

17. A computer readable medium comprising information that when executed by at least one processor causes the at least one processor to:

at least one of: operate, design, and organize a circuit that comprises:

a voltage mode differential circuit, having a first and second output terminal, that is operative to provide a first voltage via the first output terminal and second voltage via the second output terminal in response to a differential input voltage; and a bi-directional current source circuit, operatively coupled between the first and second terminals, that is operative to selectively provide current in a first and second direction between the first and second terminals based on the first voltage, the second voltage, and de-emphasis control information in order to de-emphasize the differential input voltage for communication via a differential communication link.

18. The computer readable medium of claim 17 wherein the bi-directional current source circuit is operative to provide the current in the first direction when the first voltage is greater than the second voltage and to provide the current in the second direction when the second voltage is greater than the first voltage.

19. The computer readable medium of claim 17 wherein the information comprises hardware description language.

20. A computer readable medium comprising information that when executed by at least one processor causes the at least one processor to:

at least one of: operate, design, and organize a circuit that comprises:

a voltage mode differential circuit, having a first and second output terminal, that is operative to provide a first voltage via the first output terminal and second voltage via the second output terminal in response to a differential input voltage;

a bi-directional current source circuit, operatively coupled between the first and second terminals, that is operative to selectively provide current in a first and second direction between the first and second terminals based on the first and second voltage in order to de-emphasize the differential input voltage for communication via a differential communication link; and a control circuit, operatively coupled to the bi-directional current source circuit, that is operative to selectively control a magnitude of the current to produce a de-emphasized output signal.

* * * * *